US 6,686,106 B2
(10) Patent No.:
(45) Date of Patent: Feb. 3, 2004

(12) United States Patent
Yasuno et al.

(54) PHOTOSENSITIVE RESIN COMPOSITIONS, INSULATING FILMS, AND PROCESSES FOR FORMATION OF THE FILMS

(75) Inventors: Hiroshi Yasuno, Ichihara (JP); Yoshiaki Watanabe, Ichihara (JP); Hiroyuki Sakurai, Sendai (JP)

(73) Assignee: UBE Industries, Ltd., Yamaguchi-Ken (JP)

( * ) Notice: Subject to any disclaimer, the term of this patent is extended or adjusted under 35 U.S.C. 154(b) by 134 days.

(21) Appl. No.: 09/888,561

(22) Filed: Jun. 26, 2001

(65) Prior Publication Data

US 2002/0001763 A1 Jan. 3, 2002

(30) Foreign Application Priority Data

Jun. 26, 2000 (JP) .......................... 2000-191049
Aug. 1, 2000 (JP) .......................... 2000-232807
May 25, 2001 (JP) .......................... 2001-156516
May 29, 2001 (JP) .......................... 2001-160498

(51) Int. Cl.[7] .................... G03F 7/075; G03F 7/38; G03F 7/40
(52) U.S. Cl. .................... 430/18; 430/330; 430/311; 430/283.1
(58) Field of Search .................... 430/18, 330, 311

(56) References Cited

U.S. PATENT DOCUMENTS 3,864,151 A * 2/1975 Shonebarger et al. ........ 117/72
5,262,277 A * 11/1993 Sato et al. ................ 430/283.1
5,472,823 A * 12/1995 Hagiwara et al. ........ 430/270.1
5,616,448 A * 4/1997 Kato ........................ 430/283.1
6,096,480 A 8/2000 Ishikawa et al.
2001/0043987 A1 * 11/2001 Olson et al. ................ 427/189

FOREIGN PATENT DOCUMENTS

| JP | 55 30207 | 8/1980 |
| JP | 55 41422 | 10/1980 |
| JP | 59 52822 | 12/1984 |
| JP | 02 050161 | 2/1990 |
| JP | 03 071633 | 3/1991 |
| JP | 06 258835 | 9/1994 |
| JP | 10 095848 | 4/1998 |

OTHER PUBLICATIONS

Bonk et al, eds, Acronyms, Initialisms & Abbreviations Dictionary:, 28th edition, vol. 1, part 1, A–F, Gale Group Inc, Farmington Hill, Mi, 2001, pp. xv, xxx, 388–389 and 827.*

* cited by examiner

Primary Examiner—Cynthia Hamilton
(74) Attorney, Agent, or Firm—Morgan, Lewis & Bockius LLP

(57) ABSTRACT

An imide-based photosensitive resin composition comprised of (1) a photosensitive imidosiloxane oligomer comprised of a reaction product of an imidosiloxane oligomer having a functional group reactive with an epoxy group and an epoxy compound having a photosensitive group, (2) an isocyanate having an unsaturated bond, (3) a photopolymerization initiator, and (4) an organic solvent, an insulating film obtained by curing the same, and a process for production of such an insulating film.

11 Claims, 1 Drawing Sheet

PHOTOSENSITIVE RESIN COMPOSITIONS, INSULATING FILMS, AND PROCESSES FOR FORMATION OF THE FILMS

BACKGROUND OF THE INVENTION

1. Field of the Invention

The present invention relates to a photosensitive resin composition, insulating film, and process for forming the film, more particularly relates to an imide-based photosensitive resin composition suitable for a high density flexible wiring board, able to be alkali developed, able to be cured at a low temperature, and giving a film low in elastic modulus and superior in flex resistance and chemical resistance, a pre-baked film, an insulating film and a process for formation of the same.

The photosensitive resin composition of the present invention is suitable as a material for formation of a coating material for a COF (chip on flexible printed board), BGA (ball grid array), CSP (chip scale package), or other flexible wiring board or a material for forming an interlayer insulating film, a protective film for a circuit, a protective film for a semiconductor element, and a passivation film.

2. Description of the Related Art

A material for formation of a coating material for a COF, BGA, CSP, or other flexible wiring board, an interlayer insulating film, a protective film for a semiconductor integrated circuit, a protective film for a semiconductor element, a passivation film, etc. is required to have an excellent heat resistance and insulation property. A photosensitive heat resistant material is sought due to the requirements for higher density and higher integration. Further, various polyimides having a high insulation property and heat resistance have been proposed.

For example, known in the art is a method of coating a polyimide resin on the entire surface of a device substrate, partially protecting the surface with a photoresist, and etching the polyimide resin film by hydrazine etc., that is, an alkali etching method.

In this method, however, the steps are complicated. Further, it is necessary to use highly toxic hydrazine or another strong alkali aqueous solution as an etching solution.

Alternatively, an etching method using an organic solvent as a developing agent has been proposed for a photosensitive polyimide-based resin, for example, a precursor of a polyimide resin, that is, a polyamic acid, in which a photopolymerizable acryloyl group is introduced at an ester bond (Japanese Examined Patent Publication (Kokoku) No. 55-30207, Japanese Examined Patent Publication (Kokoku) No. 55-341422, etc.) or in which an acryloyl group is introduced in an amic acid at a salt structure (Japanese Examined Patent Publication (Kokoku) No. 59-52822 etc.)

Further, alkali developing type photosensitive polyimides are being developed. For example, a photosensitive polyimide obtained from a positive type polymer comprised of a polyamic acid having naphthoquinone diazide introduced at a carboxyl group (Japanese Unexamined Patent Publication (Kokai) No. 6-258835) and a negative type photosensitive polyimide comprised of a polyamic acid having a photopolymerizable acryloyl group introduced at an ester bond and further having a carboxyl group etc. introduced into the side chain to make the polyamic acid soluble in a basic aqueous solution (Japanese Unexamined Patent Publication (Kokai) No. 10-95848) have been proposed.

These photosensitive polyimide resins, however, require high temperature heating of over 350° C. for post-baking, so there are the problems of a detrimental effect on the dimensional stability of the board and a low heat resistance or chemical resistance (acid resistance, alkali resistance, solvent resistance, etc.) of the obtained insulating film.

SUMMARY OF THE INVENTION

An object of the present invention is to provide an imide-based photosensitive resin composition having an imide-based resin which is soluble in an organic solvent, not requiring high temperature post-baking, having an imide-based resin which is photosensitive and can be developed even by a weak alkali aqueous solution, and giving an insulating film by post-baking which has heat resistance, chemical resistance (alkali resistance, acid resistance), and a high insulation property, such an insulating film, and a process for forming such an insulating film.

According to a first aspect of the invention, there is provided an imide-based photosensitive resin composition comprised of (1) a photosensitive imidosiloxane oligomer comprised of a reaction product of an imidosiloxane oligomer having a functional group reactive with an epoxy group obtained by reacting a total of diamines of 70 to 90 mol % from 10 to 50 mol % of an aromatic diamine having a functional group reactive with an epoxy group, 10 to 70 mol % of diaminopolysiloxane, and 0 to 20 mol % of an aromatic diamine having plural benzene rings, with respect to 100 mol % of a tetracarboxylic dianhydride and an epoxy compound having a photosensitive group, (2) an isocyanate having an unsaturated bond, (3) a photopolymerization initiator, and (4) an organic solvent, wherein the ratio of the components is 1 to 80 parts by weight of the (2) isocyanate having an unsaturated bond and 0.01 to 30 parts by weight of the (3) photopolymerization initiator with respect to 100 parts by weight of the (1) photosensitive imidosiloxane oligomer.

According to a second aspect of the invention, there is provided a pre-baked film of the imide-based photosensitive resin composition coated on a support.

According to a third aspect of the invention, there is provided an insulating film obtained by coating an imide-based photosensitive resin composition on a substrate, then prebaking it to form a thin film, exposing it, alkali developing it, then post-baking it to obtain a cured film.

According to a fourth aspect of the invention, there is provided a process for forming an insulating film comprising coating an imide-based photosensitive resin composition on a substrate, then prebaking it to form a thin film, exposing it, alkali developing it, then post-baking it.

According to a fifth aspect of the invention, there is provided a process for forming an insulating film comprising laminating a dry film of a photosensitive resin composition containing a resin component containing a reactive group in a molecule and a monomer having reactivity with a reactive group on a substrate, alkali developing it, and then post-baking it at not more than 250° C., wherein the insulating film has an elastic modulus of not less than 5 kgf/mm$^2$ and not more than 100 kgf/mm$^2$, an elongation rate of not less than 5%, and alkali resistance.

BRIEF DESCRIPTION OF THE DRAWINGS

These and other objects and features of the present invention will become clearer from the following description of the preferred embodiments given with reference to the attached drawings, wherein.

Figure 1:
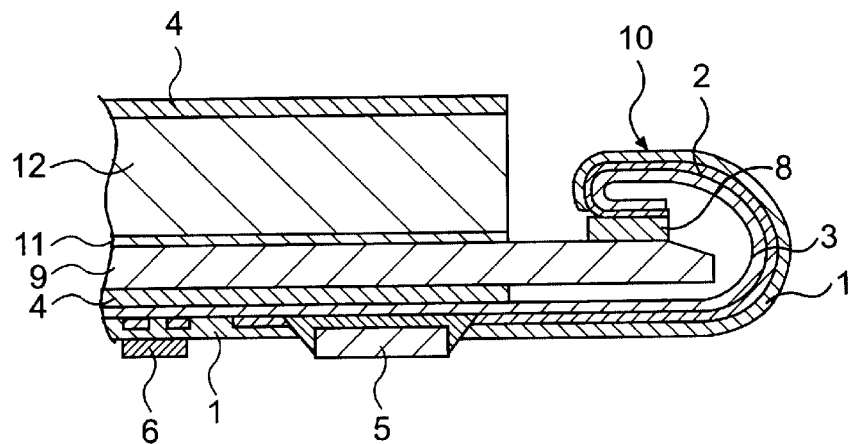
FIG. 1 is a partial sectional view of a COF using a high density flexible wiring board using an insulating film of the present invention for a polyimide film board.
Figure 2:
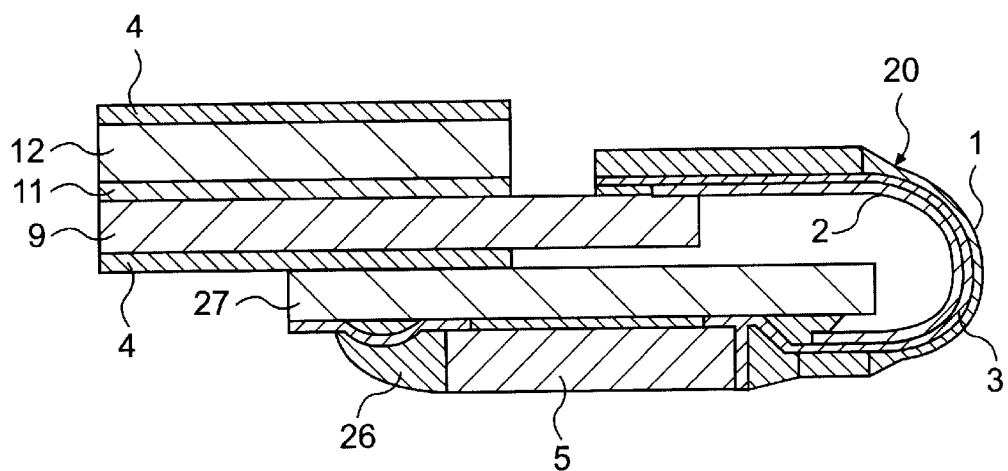
FIG. 2 is a partial sectional view of a bending TAB using a high density flexible wiring board using an insulating film of the present invention for a polyimide film board.

In the figures, reference number 10 indicates a high density flexible wiring board, 2 polyimide film board, 3 metal interconnection, 1 insulating and low elastic modulus coating formed from a photosensitive ink, 5 IC driver, 6 a chip device, 8 an aluminum electrode, 9 TFT array board, 4, deflector plate, 11 liquid crystal, 12 color filter, 20 a high density flexible wiring board for a bending TAB, 26 a sealant, and 27 a printed wiring board.

DESCRIPTION OF THE PREFERRED EMBODIMENTS

The imide-based photosensitive resin composition of the present invention is comprised of (1) a photosensitive imidosiloxane oligomer comprised of a reaction product of an imidosiloxane oligomer having a functional group reactive with an epoxy group obtained by reacting a total of diamines of 70 to 90 mol % from 10 to 50 mol % of an aromatic diamine having a functional group reactive with an epoxy group, 10 to 70 mol % of diaminopolysiloxane, and 0 to 20 mol % of an aromatic diamine having plural benzene rings, with respect to 100 mol % of a tetracarboxylic dianhydride and an epoxy compound having a photosensitive group, (2) an isocyanate having an unsaturated bond, (3) a photopolymerization initiator, and (4) an organic solvent, wherein the ratio of the components is 1 to 80 parts by weight of the (2) isocyanate having an unsaturated bond and 0.01 to 30 parts by weight of the (3) photopolymerization initiator with respect to 100 parts by weight of the (1) photosensitive imidosiloxane oligomer.

The imide-based photosensitive resin composition may contain another type of (5) photo-crosslinking agent and/or (6) inorganic filler.

The (1) photosensitive imidosiloxane oligomer may be obtained by adding the imidosiloxane oligomer having a functional group reactive with an epoxy group and the epoxy compound having a photosensitive group together with other components for mixing and reaction.

Alternatively, the (1) photosensitive imidosiloxane oligomer may be obtained using an aromatic diamine compound of the formula

(where, Bz indicates a benzene ring, $R_1$ and $R_2$ are hydrogen atoms, A is a direct bond, S, S, CO, $SO_2$, SO, $CH_2$, $C(CH_3)_2$, OBzO, Bz, $OBzC(CH_3)_2BzO$, or other bivalent group, X is a carboxyl group or hydroxyl group, preferably a carboxyl group, n is 2 or 3, y is 1 or 2, and n+y=4) as an aromatic diamine having a functional group reactive with an epoxy group and using a diaminopolysiloxane of the formula:

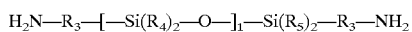

(where, $R_3$ indicates a bivalent hydrocarbon residue, $R_4$ and $R_5$ indicate independently an alkyl group of one to three carbon atoms or phenyl group, and 1 indicates 3 to 50) as a diaminopolysiloxane.

Alternatively, the (1) photosensitive imidosiloxane oligomer may be obtained using a total of 70 to 90 mol % of diamines from 15 to 45 mol % of an aromatic diamine having a functional group reactive with an epoxy group and 10 to 70 mol % of a diaminopolysiloxane with respect to 100 mol % of a tetracarboxylic dianhydride.

The insulating film of the present invention is obtained by coating an imide-based photosensitive resin composition on a substrate, then prebaking it to form a thin film, exposing it, alkali developing it, then post-baking it to obtain a cured film.

The elastic modulus of the cured film is at least 5 kgf/mm$^2$ and not more than 100 kgf/mm$^2$.

The elongation rate of the cured film is at least 5% and not more than 50%.

The above insulating film has a low elastic modulus, is superior in flex resistance, is able to be cured at a low temperature of not more than 200° C., and is suitable as an overcoat material for a COF (chip on flexible printed board).

The process of forming an insulating film comprises coating an imide-based photosensitive resin composition on a substrate, then prebaking it to form a thin film, exposing it, alkali developing it, then post-baking it.

The process for forming the above insulating film may comprise post-baking at not more than 250° C., in particular 150 to 250° C.

In the present invention, as the photosensitive imide component, it is necessary to use a (1) photosensitive imidosiloxane oligomer comprised of a reaction product of an imidosiloxane oligomer having a functional group reactive with an epoxy group obtained by reacting a total of diamines of 70 to 90 mol % from 10 to 50 mol % of an aromatic diamine having a functional group reactive with an epoxy group, 10 to 70 mol % of diaminopolysiloxane, and 0 to 20 mol % of an aromatic diamine having plural benzene rings, with respect to 100 mol % of a tetracarboxylic dianhydride and an epoxy compound having a photosensitive group. The photosensitive imidosiloxane oligomer is an imide oligomer having an acid anhydride terminal group obtained by reacting the components in the range of the above ratios, so enables a high solvent solubility and development by a weak alkali aqueous solution after exposure and prevents the occurrence of warping of the board and cracks due to bending.

The reaction between the tetracarboxylic dianhydride and diamine can be performed in a solvent by a random, block, or mixing-rebonding reaction of two reaction solutions. Further, the imidosiloxane oligomer having a functional group reactive with the epoxy group can also be used for the following reactions as it is without being isolated from the solution.

As the tetracarboxylic dianhydride, 3,3',4,4'-biphenyltetracarboxylic dianhydride, 2,2',3,3'-biphenyltetracarboxylic dianhydride, 2,3,3',4'-biphenyltetracarboxylic dianhydride, 3,3',4,4'-benzophenonetetracarboxylic dianhydride, bis(3,4-dicarboxyphenyl)ether dianhydride, pyromellitic dianhydride, 2,3,6,7-napthalenetetracarboxylic dianhydride, 1,2,5,6-naphthalenetetracarboxylic dianhydride, 1,2,4,5-naphthalenetetracarboxylic dianhydride, 1,4,5,8-naphthalenetetracarboxylic dianhydride, 2,2-bis(2,5-dicarboxyphenyl)propane dianhydride, 1,1-bis(2,3-dicarboxyphenyl)ethane dianhydride, 1,1-bis(3,4-dicarboxyphenyl)sulfone dianhydride, 1,3-bis(3,4-dicarboxyphenyl)-1,1,3,3-tetramethyldisiloxane dianhydride, and other aromatic tetracarboxylic dianhydrides may be mentioned.

Further, as a tetracarboxylic dianhydride, a cyclopentanetetracarboxylic dianhydride, cyclohexanetetracarboxylic dianhydride, methylcyclohexenetetracarboxylic dianhydride, and other alicyclic tetracarboxylic dianhydride may be mentioned.

The tetracarboxylic dianhydrides may be used alone or may be used in combinations of two or more types.

In particular, for obtaining a high concentration imide-based photosensitive resin, as a tetracarboxylic dianhydride having a high solubility in a solvent and having a high heat resistance of the obtained imide insulating film, 2,3,3',4'-biphenyltetracarboxylic dianhydride, 3,3',4,4'-benzophenonetetracarboxylic dianhydride, bis(3,4-dicarboxyphenyl)ether dianhydride, 1,3-bis(3,4-dicarboxyphenyl)-1,1,3,3-tetramethyldisiloxane dianhydride, and other aromatic tetracarboxylic dianhydrides etc. may be mentioned. In particular, 2,3,3',4'-biphenyltetracarboxylic dianhydride is preferable.

As an aromatic diamine having a functional group reactive with an epoxy group, it is possible to use an aromatic diamine compound of the formula

$H_2N-Bz(R_1)_n(X)_y-A-(X)_y(R_2)_nBz-NH_2$ (where, Bz indicates a benzene ring, $R_1$ and $R_2$ are hydrogen atoms, A is a direct bond, S, S, CO, $SO_2$, SO, $CH_2$, $C(CH_3)_2$, $OBzO$, Bz, $OBzC(CH_3)_2BzO$, or other bivalent group, X is a carboxyl group or hydroxyl group, n is 2 or 3 (preferably 3), y is 1 or 2 (preferably 1), and n+y=4).

As the diaminopolysiloxane, it is possible to use a diaminopolysiloxane of the formula:

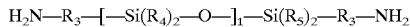

$H_2N-R_3-[-Si(R_4)_2-O-]_1-Si(R_5)_2-R_3-NH_2$ (where, $R_3$ indicates a bivalent hydrocarbon residue, $R_4$ and $R_5$ indicate independently an alkyl group of one to three carbon atoms or phenyl group, and 1 indicates 3 to 50).

As the diamine component, the above two types of diamines are essential, but it is also possible to use a small amount of an aromatic diamine having plural benzene rings not having a group reactive with an epoxy group. As this aromatic diamine, 1,4-bis(4-aminophenoxy)benzene, 1,3-bis(4-aminophenoxy)benzene, 1,4-bis(4-aminophenyl)benzene, and other aromatic diamines having three benzene rings or bis[4-(4-aminophenoxy)phenyl]sulfone, 2,2-bis[4-(4-aminophenoxy)phenyl]propane, and other aromatic diamines having four benzene rings etc. may be mentioned.

As specific examples of an aromatic diamine having a functional group reactive with an epoxy group, 2,4-diaminophenol or other diaminophenol compounds, 3,3'-diamino-4,4'-dihydroxybiphenyl, 4,4'-diamino-3,3'-dihydroxybiphenyl, 4,4'-diamino-2,2'-dihydroxydiphenyl, 4,4'-diamino-2,2',5,5'-tetrahydroxybiphenyl, and other diaminodihydroxybiphenyl compounds, 3,3'-diamino-4,4'-dihydroxdiphenylmethane, 4,4'-diamino-3,3'-dihydroxydiphenylmethane, 4,4'-diamino-2,2'-dihydroxydiphenylmethane, 2,2-bis[3-amino-4-hydroxyphenyl]propane, 2,2-bis[4-amino-3-hydroxyphenyl]propane, 2,2-bis[3-amino,4-hydroxyphenyl]hexafluoropropane, 4,4'-diamino-2,2',5,5'-tetrahydroxydiphenylmethane, and other diaminodihydroxydiphenyl alkane compounds, 3,3'-diamino-4,4'-dihydroxydiphenyl ether, 4,4'-diamino-2,2'-dihydroxydiphenyl ether, 4,4'-diamino-2,2',5,5'-tetrahydroxydiphenyl ether, or other diaminodihydroxydiphenyl ether compounds, 3,3'-diamino-4,4'-dihydroxydiphenyl sulfone, 4,4'-diamino-3,3'-dihydroxydiphenyl sulfone, 4,4'-diamino-2,2'-dihydroxydiphenyl sulfone, 4,4-diamino-2,2',5,5'-tetrahydroxydiphenyl sulfone, and other hydroxydiphenyl sulfone compounds, 2,2-bis[4-(4-amino-3-hydroxyphenoxy)phenyl]propane and other bis (aminohydroxyphenoxyphenyl)alkane compounds, 4,4'-bis(4-amino-3-hydroxyphenoxy)biphenyl and other bis (aminohydroxyphenoxyphenyl)alkane compounds, 4,4'-bis(4-amino-3-hydroxyphenoxy)biphenyl and other bis (aminohydroxyphenoxy)biphenyl compounds, 2,2-bis[4-(4-amino-3-hydroxyphenoxy)biphenyl compounds, 2,2-bis[4-(4-amino-3-hydroxyphenoxy)phenyl]sulfone, and other bis (aminohydroxyphenoxyphenyl)sulfone compounds, and other diamine compounds having OH groups may be mentioned.

Further, as specific examples of an aromatic diamine having a functional group reactive with an epoxy group, 3,3'-diamino-4,4'-dicarboxybiphenyl, 4,4'-diamino-3,3'-dicarboxybiphenyl, 4,4'-diamino-2,2'-dicarboxybiphenyl, 4,4'-diamino-2,2',5,5'-tetracarboxybiphenyl, and other carboxybiphenyl compounds, 3,3'-diamino-4,4'-dicarboxydiphenylmethane, 4,4'-diamino-3,3'-dicarboxydiphenylmethane, 4,4'-diamino-2,2'-dicarboxydiphenylmethane, 2,2-bis[3-amino-4-carboxyphenyl]propane, 2,2-bis[4-amino-3-carboxyphenyl]propane, 2,2-bis[3-amino-4-carboxyphenyl]hexafluoropropane, 4,4'-diamino-2,2',5,5'-tetracarboxybiphenyl, and other diaminodicarboxydiphenyl alkane compounds, 3,3'-diamino-4,4'-dicarboxydiphenyl ether, 4,4'-diamino-3,3'-dicarboxydiphenyl ether, 4,4'-diamino-2,2'-dicarboxydiphenyl ether, 4,4'-diamino-2,2'5, 5'-tetracarboxydiphenyl ether, and other diaminodicarboxydiphenyl ether compounds, 3,3'-diamino-4,4'-dicarboxydiphenyl sulfone, 4,4'-diamino-3,3'-dicarboxydiphenyl sulfone, 4,4'-diamino-2,2',5,5'-tetracarboxydiphenyl sulfone, and other diaminodicarboxydiphenyl sulfone compounds, 2,2-bis[4-(4-amino-3-carboxyphenoxy)phenyl]propane and other bis (aminocarboxyphenoxyphenyl)alkane compounds, 4,4'-bis(4-amino-3-carboxyphenoxy)biphenyl and other bis (aminocarboxyphenoxy)biphenyl compounds, 2,2-bis[4-(4-amino-3-carboxyphenoxy)phenyl]sulfone and other bis (aminocarboxyphenoxyphenyl)sulfone compounds, and other diamine compounds having COOH groups may be mentioned.

Further, the diaminopolysiloxane of another component of the diamine is a compound of the formula

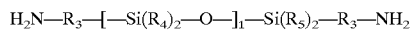

$H_2N-R_3-[-Si(R_4)_2-O-]_1-Si(R_5)_2-R_3-NH_2$ (where, $R_3$ indicates a bivalent hydrocarbon residue, $R_4$ and $R_5$ indicate independently an alkyl group having one to three carbon atoms or phenyl group, and 1 indicates 3 to 50), preferably a compound where, in the formula, $R_4$ and $R_5$ is a methylene group or phenylene group having two to six carbon atoms, in particular three to five carbon atoms. Further, in the above formula, 1 is 4 to 30, particularly preferably 4 to 20. Further, in the above formula, so long as 1 is 3 to 50, the component may be comprised of a uniform compound or a mixture of 1 number of different compounds. In the case of a mixture, the 1 of the mean value calculated from the amino equivalents is preferably 3 to 50, particularly 4 to 30, more particularly 4 to 20.

As a specific example of the above diaminopolysiloxane, α,ω-bis(2-aminoethyl)polydimethylsiloxane, α,ω-bis(3-aminopropyl)polydimethylsiloxane, α,ω-bis(4-aminophenyl)polydimethylsiloxane, α,ω-bis(4-amino-3- methylphenyl)polydimethylsiloxane, α,ω-bis(3-aminopropyl)polydiphenylsiloxane, α,ω-bis(4-aminobutyl)polydimethylsiloxane, etc. may be mentioned.

The imidosiloxane oligomer having a functional group reactive with an epoxy group is for example obtained by dissolving a tetracarboxylic dianhydride in a solvent, adding a diaminopolysiloxane and an aromatic diamine having a functional group reactive with the epoxy group to the obtained solution, sometimes adding an aromatic diamine having plural benzene rings, causing a reaction by an ordinary method, and cooling the obtained imidosiloxane oligomer solution.

The imidosiloxane oligomer having a functional group reactive with an epoxy group may be separated from the reaction solution for use or the reaction solution may be used as it is.

As the reaction solvent, a nitrogen-containing solvent, for example, N,N-dimethylacetoamide, N,N-diethylacetoamide, N,N-dimethylformamide, N,N-diethylformamide, N-methyl-2-pyrrolidone, 1,3-dimethyl-2-imidazolidinone, N-methylcaprolactam, etc., sulfur atom-containing solvent, for example, dimethylsulfoxide, diethylsulfoxide, dimethylsulfone, diethylsulfone, hexamethylsulfonamide, etc., oxygen-containing solvent, for example, γ-butyrolactone, phenol-based solvent, for example, cresol, phenol, xylenol, etc., a glyme-based solvent, for example, diethyleneglycol dimethylether (diglyme), triethyleneglycol dimethylether (triglyme), tetraglyme, etc., acetone, ethyleneglycol, dioxane, tetrahydrofuran, etc. may be mentioned.

As an epoxy compound having a photosensitive group in the present invention, glycidyl methacrylate, glycidyl acrylate, glycidyl polysiloxane methacrylate, a half-epoxy (meth)acrylate (for example, a compound wherein about five of the about 10 epoxy groups are substituted by an acrylate or methacrylate group, specifically Ripoxy 630X-501 (product name, made by Showa Highpolymer Co., Ltd.)) may be mentioned.

The (1) photosensitive imidosiloxane oligomer in the present invention is obtained by a reaction between an imidosiloxane oligomer having a functional group reactive with an epoxy group and the epoxy compound having a photosensitive group by a method known in itself. For example, it may be obtained by adding an epoxy compound having a photosensitive group to a solution of an imidosiloxane oligomer having a functional group reactive with an epoxy group or adding an epoxy compound having a photosensitive group along with other components and uniformly mixing them at room temperature.

The amount of the epoxy compound having a photosensitive group used is an amount giving 3 equivalents from the equivalent of epoxy groups with respect to the functional groups (COOH or OH) reactive with the epoxy group, preferably about 1 to 80 parts by weight with respect to 100 parts by weight of the imidosiloxane oligomer having a functional group reactive with an epoxy group.

In the present invention, the (1) photosensitive imidosiloxane oligomer and (2) isocyanate compound having an unsaturated bond are used in combination. The isocyanate group bonds with the acid anhydride of an imide terminal remaining after alkali development, while the remaining unsaturated bonds can be three-dimensionally crosslinked by heating at the time of the post-baking, whereby heat resistance of the insulating film is obtained.

As the (2) isocyanate having an unsaturated bond, preferably having an unsaturated double bond, methacryloyl isocyanate, acryloyl isocyanate, methacryloylethyl isocyanate, acryloylethyl isocyanate, methacryloylethyl isocyanate, acryloxyethyl isocyanate, vinyl dimethylbenzyl isocyanate, m-isopropenyl-α,α-dimethylbenzyl isocyanate, 2-methacryloyloxyethyl isocyanate, etc. may be mentioned. These may be used alone or in combinations of two or more types.

Further, as the (2) isocyanate having an unsaturated bond, a reaction product of a polyisocyanate having two to three isocyanate groups in its molecule and a compound having at least one OH group and at least one type of unsaturated double bond in its molecule may be used.

As the polyisocyanate, hexamethylene diisocyanate, octamethylene diisocyanate, isophoron diisocyanate, 2,2,4-trimethylhexamethylene diisocyanate, dicyclohexylmethane diisocyanate, tetramethylene diisocyanate, tolylene diisocyanate, 4,4-diphenylmethanediisocyanate, naphthalene diisocyanate, 3,3'-dimethyl-4,4'-bisphenylene diisocyanate, metaxylene diisocyanate, etc. may be mentioned. Among these, a diisocyanate having an isocyanate group different in reactivity is preferable. In particular, 2,2,4-trimethylhexamethylene diisocyanate and tolylene diisocyanate are preferable.

As a compound having at least one OH group and at least one type of unsaturated double bond in its molecule, hydroxyethyl acrylate, hydroxyethyl methacrylate, hydroxypropyl acrylate, hydroxypropyl methacrylate, hydroxybutyl acrylate, hydroxybutyl methacrylate, neopentylglycol monoacrylate, neopentylglycol monomethacrylate, trimethylolmethane monoacrylate, trimethylolmethane monomethacrylate, tetramethylolmethane monoacrylate, tetramethylolmethane monomethacrylate, and other hydroxyalkyl esters of acrylic acid or methacrylic acid, ethyleneglycol monoacrylate, ethyleneglycol monomethacrylate, propyleneglycol monoacrylate, propyleneglycol monomethacrylate, polyethylene monoacrylate, polyethylene monomethacrylate, and other (poly)alkyleneglycol monoacrylates or (poly)alkyleneglycol monomethacrylates, hydroxybutyrovinyl ethers, and other hydroxyalkylvinyl ethers, allyl alcohols, or addition products of the above and ε-caprolactone, γ-valerolactone, and other lactones etc. may be mentioned. These may be used alone or in combinations of two or more types.

Among the compounds having at least one OH group and at least one type of unsaturated double bond, from the viewpoint of polymerizability and reactivity, hydroxyalkyl esters of acrylic acid or methacrylic acid and addition products of hydroxyalkyl esters of acrylic acid or methacrylic acid and lactones are preferable. These may be used alone or in combinations of two or more types.

In the present invention, it is necessary to use 1 to 80 parts by weight, preferably 1 to 25 parts by weight, of the (2) isocyanate having an unsaturated bond with respect to 100 parts by weight of the (1) photosensitive imidosiloxane oligomer.

If the ratio of the (2) isocyanate compound having an unsaturated bond is less than the lower limit, the chemical resistance of the insulating film (alkali resistance and acid resistance) falls, while even if large, there is no further effect and the performance of the insulating film conversely falls.

As the (3) photopolymerization initiator in the present invention, for example, Michler's ketone, 4,4'-bis(diethylamino)benzophenone, acetophenone, benzoin, 2-methylbenzoin, benzoin methyl ether, benzoin ethyl ether, benzoin isopropyl ether, benzoin isobutyl ether, 2-t-butylanthraquinone, 1,2-benzo-9,10-anthraquinone, methylanthraquinone, thioxanthone, 2,4-diethyl thioxanthone, 2-isopropyl thioxanthone, 1-hydroxycyclohexylphenyl ketone, 2-methyl-[4-(methylthio)phenyl]-2-morpholinopropanone-1, 2-benzyl-2-dimethylamino-1-(4-morpholinophenyl)-butanone-1, diacetylbenzyl, benzyldimethyl ketal, benzyldiethyl ketal, 2(2'-furylethylidene)-4,6-bis(trichloromethyl)-S-triazine, 2[2'(5"-methylfuryl)ethylidene]-4,6-bis(trichloromethyl)-S-triazine, 2(p-methoxyphenyl)-4,6-bis(trichloromethyl)-S-triazine, 2,6-di(p-azidobenzal)-4-methylcyclohexanone, 4,4'-diazidechalcone, di(tetraalkylammonium)-4,4'-diazidestilbene-2,2'-disulfonate, N-phenylglycine, 3-phenyl-5-isoxazolone, 1-phenyl-1,2-butanedion-2-(o-methoxycarbonyl)oxime, etc. may be mentioned.

The amount of the (3) photo-polymerization initiator used is 0.01 to 30 parts by weight, particularly 0.5 to 30 parts by weight, particularly preferably 1 to 20 parts by weight, with respect to 100 parts by weight of the (1) photosensitive imidosiloxane oligomer. If the amount of the photopolymerization initiator used is less than the lower limit, the exposure is not sufficient, while even if the amount of the photopolymerization initiator used is greater than the higher limit, there is no further effect and instead the performance of the insulating film declines.

As the adjuvant (sensitizing agent) of the (3) photopolymerization initiator, 4-dimethylaminobenzoate ethylester, 4-diethylaminobenzoate methylester, methyl dimethylaminoanthranilate, benzophenone, 2,6-bis-(4-diethylaminobenzal)-4-methyl-cyclohexanone, etc. may be jointly used.

As the (4) organic solvent in the present invention, for example, N-methyl-2-pyrrolidone, N,N-dimethylacetoamide, N,N'-dimethylformamide, dimethylsulfoxide, γ-butyrolactone and other organic polar solvents, diethyleneglycol dimethylether (DG), triethyleneglycol dimethylether (TG) propyleneglycol diethylether, and other ether-based solvents may be mentioned. Parts of these solvents may be substituted by ethyl cellosolve, butyl cellosolve, propyleneglycol monobutylether, and other alcohols, methylethylketone, methylisobutylketone, methyl-n-amylketone, cyclohexanone, and other ketones, methyl acetate, ethyl acetate, butyl acetate, ethyl lactate, diethyl oxalate, diethyl malonate, methyl-3-methoxypropionate, ethyl-3-ethoxypropionate, propyleneglycol monomethylether acetate, and other esters etc. The organic solvent may be used alone or in combinations of two or more types.

In the present invention, it is preferable to use 50 to 300 parts by weight of the (4) solvent with respect to 100 parts by weight of the (1) photosensitive imidosiloxane oligomer.

The photosensitive imidosiloxane oligomer can be used as it is without separation of the organic polar solvent used when obtaining it, but in this case it is preferable to use one with a boiling point of at least 140° C. and not more than 210° C. In particular, if using diethyleneglycol dimethylether (DG), triethyleneglycol dimethylether (TG), γ-butyrolactone, etc., the scattering due to evaporation of the solvent is reduced, so it is possible to coat the solution composition without hindrance.

The imide-based photosensitive resin composition of the present invention can be obtained by uniformly mixing the above components, but it is more preferable to further include another type of (5) photo-crosslinking agent and/or (6) inorganic filler.

As the (5) photo-crosslinking agent, a phosphoric ester-based photo-crosslinking agent having a (meth)acryloyl group comprised of an acryloxy $C_1$ to $C_4$ lower alkylphosphate, bisacryloxy $C_1$ to $C_4$ lower alkylphosphate, a methacryloxy $C_1$ to $C_4$ lower alkylphosphate, a bis-methacryloxy $C_1$ to $C_4$ lower alkylphosphate, for example, acryloxyethyl phosphate, bisacryloxyethyl phosphate, and mixtures of the same, methacryloxyethyl phosphate, bismethacryloxyethyl phosphate, and mixtures of the same is preferable.

As a commercially available photo-crosslinking agent of a phosphoric ester having a (meth)acryloyl group, a mixture of methacryloxyethylphosphate and bismethacryloxyethyl phosphate (made by Nippon Kayaku Co., PM2) is particularly preferred.

The amount of the phosphoric ester-based photo-crosslinking agent having a (meth)acryloyl group is 1 to 15 parts by weight, particularly preferably 2 to 15 parts by weight, with respect to 100 parts by weight of the (1) photosensitive imidosiloxane oligomer. If the amount of the photo-crosslinking agent selected from acryloyl phosphate or methacryloyl phosphate used is small, the alkali developability falls, while if the amount used is too great, the bondability with a board or the heat resistance of the insulating film obtained after heat treatment deteriorate.

It is also possible to use another photo-crosslinking agent along with the above phosphoric ester based photo-crosslinking agent having a (meth)acryloyl group.

For example, a carboxy-containing half epoxy acrylate (for example, made by Kagawa Chemical, ENC), 2-hydroxyethyl acrylate, 2-hydroxybutyl acrylate, and other 2-hydroxyalkyl acrylates, mono or diacrylates of glycols (ethyleneglycol, methoxytetraethyleneglycol, polyethyleneglycol, propyleneglycol, etc.), N,N-dimethylacrylamide, N-methylolacrylamide, and other acrylamides, N,N-dimethylaminoethyl acrylate and other aminoalkyl acrylates, trimethylolpropane, pentaerythritol, dipentaerythritol, and other polyhydric alcohols, polyhydric acrylates of adducts of ethylene oxides, propylene oxides, or ε-caprolactone adducts of these, phenoxy acrylate, phenoxyethyl acrylate, and other phenols, acrylates of ethylenedioxide or propylenedioxide adducts of these, epoxy acrylates and melamine acrylates derived from trimethylolpropane triglycidylether and other glycidylethers and/or methacrylates for the above acrylates, polyhydric (meth)acrylic acid derivative compounds [for example, isocyanulate tris(2-acryloyloxyethyl)] or an addition product with diaminosiloxane, an esterified product of polysiloxanediol and (meth)acrylic acid [for example, made by Shin-Etsu Chemical, X-22-164B], etc. may be mentioned.

The amount of the other photo-crosslinking agent used is not particularly limited so long as it is soluble or compatible with the (1) photosensitive imidosiloxane oligomer, but it is preferable to use 0 to 100 parts by weight, preferably 1 to 100 parts by weight, particularly 1 to 50 parts by weight, with respect to 100 parts by weight of the (1) photosensitive imidosiloxane oligomer. If the amount of the (5) photo-crosslinking agent used is too large, the bondability with a board and the heat resistance of the insulating film obtained after heat treatment deteriorate.

As the (6) inorganic filler, for example, finely divided silica, talc, mica, barium sulfate, etc. may be mentioned.

As the inorganic filler, one of any size or form may be used, but one having an average particle size of 0.001 to 15 μm, particularly 0.005 to 10 μm, specifically 0.005 to 2 μm, is preferable. If using one outside of this range, when the obtained coating is bent, cracks will occur or the bent parts will whiten.

In the present invention, it is preferable to use a combination of finely divided silica and at least one of talc, mica, and barium sulfate.

In the present invention, the amount of the (5) fine inorganic filler used is, in total, 1 to 100 parts by weight, preferably 5 to 100 parts by weight, particularly 5 to 75 parts by weight, with respect to 100 parts by weight of the (1) photosensitive imidosiloxane oligomer. This range is necessary since if the amount used is too large, bending of the film will cause cracking, while if too small, the solder heat resistance will deteriorate and the copper foil will discolor.

Further, when using a combination of finely divided silica and at least one of talc, mica, and barium sulfate, it is preferable to use, with respect to 100 parts by weight of the photosensitive imidosiloxane oligomer, 1 to 30 parts by weight, particularly 2 to 30 parts by weight, of finely divided silica and 1 to 70 parts by weight, particularly 2 to 70 parts by weight, of at least one of talc, mica, and barium sulfate.

Further, the imide-based photosensitive resin composition of the present invention may further include, in accordance with need, Phthalocyanine Blue, Phthalocyanine Green, Iodine Green, Dis-azo Yellow, Crystal Violet, titanium oxide, carbon black, naphthalene black, or other coloring agent or pigment, acryl-based anti-foam agent, fluorine-based anti-foam agent, silicone-based anti-foam agent, or other anti-foam agent, hydroquinone, hydroquinone monomethylether, phenothiazine, or other thermal polymerization inhibitor, anti-gelling agent, leveling agent, imidazole-based, thiazole-based, triazole-based, silane coupling agent, or other adhesion-improving agent, or various other additives.

As the anti-gelling agent, an N-nitroso-based anti-gelling agent is preferable.

For example, a compound of the following formula:

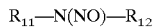

(where, one or both of $R_{11}$ and $R_{12}$ is a phenyl group, cyclohexyl group, or alkyl group of four to 18 carbon atoms, preferably a phenyl group or cyclohexyl group)

Among the compounds of the above formula, an N-nitroso-based anti-gelling agent where $R_{11}$ is a phenyl group and $R_{12}$ is a cyclohexyl group (made by Ouchi Shinko Chemical Industry, H-2) is preferred.

The amount of the N-nitroso-based anti-gelling agent is preferably 0.1 to 5 parts by weight, particularly 0.5 to 3 parts by weight, with respect to 100 parts by weight of the (1) photosensitive imidosiloxane oligomer. If the amount of the N-nitroso-based anti-gelling agent is less than the above lower limit, the pre-baking stability is low, while even if the amount of the N-nitroso-based anti-gelling agent is greater than the above upper limit, there is no further effect and conversely the physical properties of the insulating film fall.

The imide-based photosensitive resin composition of the invention can be easily obtained by adding and uniformly stirring and mixing (1-1) an imidosiloxane oligomer having a functional group reactive with an epoxy group and (1-2) an epoxy compound having a photosensitive group giving a (1) photosensitive imidosiloxane oligomer, (2) an isocyanate having an unsaturated double bond, (3) a photopolymerization initiator, (4) an organic solvent, and, if necessary, (5) a photo-crosslinking agent, (6) inorganic filler, and anti-foam agent, anti-gelling agent, coloring agent or pigment, or other additive in suitable amounts. The order of addition of the components is not particularly limited. When mixing, by mixing in a solvent, it is possible to obtain a solution composition of a photosensitive imidosiloxane oligomer or uniformly blended photosensitive imidosiloxane oligomer composition.

The imide-based photosensitive resin composition suitably has a solution viscosity at room temperature of 300 to 600 poise as a composition at the time of coating from the standpoint of the work efficiency, physical properties of the solution, properties of the protective film, etc.

In this process, first, the above imide-based photosensitive resin composition is coated on a suitable support, for example, a printed circuit board, ceramic or aluminum board, silicon wafer, film, etc. As the coating method, there are spin coating using a spinner, printing, roll coating, etc.

Next, the coating is heated and pre-baked at a temperature of not more than 100° C., preferably a temperature of 50 to 80° C., for 10 to 60 minutes to dry the coating and form a thin film.

Where the thin film of the imide-based photosensitive resin composition is used at a separate place, the thin film is preferably covered by a cover film.

After the above process, the film is irradiated with light for exposure to a desired pattern. Ultraviolet light, visible light, or light of a wavelength in the range of 300 to 500 nm is preferable.

Next, the nonirradiated parts are developed to obtain the pattern.

In this process of patterning the imide-based photosensitive resin composition of the invention, an alkali aqueous solution, preferably a weak alkali aqueous solution, is used as the developing solution.

This developing solution may contain a small amount of methanol, ethanol, n-propanol, isopropanol, N-methyl-2-pyrrolidone, and other water-soluble organic solvents.

As the alkali compound giving the above alkali aqueous solution, for example, a hydroxide, carbonate, bicarbonate, amine compound, etc. of an alkali metal, alkali earth metal, or ammonium ion may be mentioned. Specifically, sodium hydroxide, potassium hydroxide, ammonium hydroxide, sodium carbonate, potassium carbonate, ammonium carbonate, sodium bicarbonate, potassium bicarbonate, ammonium bicarbonate, tetramethylammonium hydroxide, tetraethylammonium hydroxide, tetrapropylammonium hydroxide, tetraisopropylammonium hydroxide, N-methyldiethanolamine, N-ethyldiethanolamine, N,N-dimethylethanolamine, triethanolamine, triisopropanolamine, triisopropylamine, etc. may be mentioned. If the aqueous solution exhibits basicity, it is naturally possible to use other compounds as well. In particular, it is possible to suitably mention sodium carbonate or another weak alkali compound.

The concentration of an alkali compound is normally 0.1 to 20 wt %, particularly preferably 1 to 3%.

As the alkali development method, it is possible to use various systems such as spraying, puddling, dipping, and ultrasonics. The pattern formed by the development is rinsed. As the rinse solution, spraying by water, an acidic aqueous solution, etc. may be mentioned.

Next, heat treatment is performed to post-bake and crosslink the cured film of the imide-based photosensitive resin composition comprising the photosensitive imidosiloxane oligomer, an isocyanate having unsaturated bonds, photopolymerization initiator, and preferably a photo-crosslinking agent so as to thereby obtain a final pattern with excellent heat resistance.

The post-baking is preferably carried out at a temperature of not more than 250° C., in particular 150 to 200° C., for 30 to 120 minutes.

The insulating film obtained from the imide-based photosensitive resin composition of the present invention can be used as a cover coat of a flexible copper clad board, a solder resist film, etc.

Further, the insulating film preferably has a flexibility of a radius of curvature of at least 100 mm, particularly at least 300 mm, a solder heat resistance of at least 260° C.×10 sec, resistance to acetone, methanol, and other solvents, alkali resistance, acid resistance, and electrical properties.

The present invention will now be explained with reference to examples.

The compounds used in the examples are listed below along with their abbreviations.

a-BPDA: 2,3,3',4'-biphenyltetracarboxylic dianhydride
DAPSi: α,ω-bis(3-aminopropyl)polydimethylsiloxane
MBAA: bis(3-carboxy,4-aminophenyl)methane
BAPP: 2,2-bis[4-(4-aminophenoxy)phenyl]propane
TG: Triglyme
DG: Diglyme The physical properties were evaluated as follows in the examples.

Viscosity: Measured by E-type viscometer (made by Tokyo Keiki), 25° C., using ST rotor Viscosity stability: Indicated by ratio of viscosity after 90 days storage with respect to viscosity one day after storage 1) Mechanical properties: Samples heat treated at 200° C. for 1 hour were measured for tensile strength, elongation rate, and initial elastic modulus based on ASTM D882.

2) Thermal properties: Samples heat treated at 200° C. for 1 hour were measured for the 5% weight loss temperature and the thermal decomposition temperature by a Seiko Instruments thermogravimetric analyzer (SSC-5200 TGA-DTA320).

3) Electrical properties: Samples heat treated at 200° C. for 1 hour were evaluated from the surface resistance and volume resistance.

Volume resistance: Measured by JIS K 6911
Insulation breakdown: Measured by JIS C-2110
Dielectric constant: Measured by JIS K 6911
Dielectric loss: Measured by JIS K 6911

4) Chemical resistance: Samples heat treated at 200° C. for 1 hour were measured for their weight loss after immersion in a 25° C. chemical (10% sodium hydroxide or acetone) for 30 minutes 5) Hygroscopicity: Samples heat treated at 200° C. for 1 hour were measured for their weight gain after immersion in 25° C. water for 24 hours.

6) Radius of curvature: Measured based on JIS C 5012
7) Solder heat resistance: Measured based on JIS C 6481

EXAMPLE 1

73.56 g (250 mmol) of a-BPDA was dissolved in 174.2 g of triglyme (TG) in a glass flask, then 108.3 g (125 mmol) of α,ω-bis(3-aminopropyl)polydimethyl-siloxane (DAPSi, amino equivalent 433) was added to cause a reaction at 180° C. for 1 hour. Next, 11.45 g (40 mmol) of MBAA was added at the same temperature and a reaction caused at 180° C. for 4 hours to obtain an imidosiloxane oligomer solution.

10.96 g of 2-methacryloyloxyethyl isocyanate was added to this oligomer solution and the mixture stirred at room temperature for 1 hour. 0.812 g of Phthalocyanine Green was added and dispersed, the solution was filtered.

7.87 g of an anti-foam agent (Dow Chemical, DB-100), 55.2 g of a photopolymerization initiator (Ciba-Geigy, Irgacure 651), 54.65 g of a half epoxy acrylate (made by Showa Highpolymer Co., Ltd., Ripoxy 630X-501), 32.48 g of a half epoxy acrylate containing carboxy as a photo-crosslinking agent (made by Kagawa Chemical, ENC), 15.74 g of polyethylene glycol dimethacrylate (made by Shin-Nakamura Chemical, NK9G), and 1.57 g of methacryloyl phosphate (made by Nippon Kayaku, PM2) as an adhesion improving photo-crosslinking agent were added to 300 g of the above filtered solution (solid content: 52.3%) and stirred. Next, 47.20 g of barium sulfate as an inking agent, 15.73 g of talc (average particle size of 1.8 μm), and 27.54 g of finely divided silica (Aerosil No. 200, made by Nippon Aerosil, average particle size of 12 nm) were homogeneously stirred and the mixture allowed to stand overnight. This mixture was kneaded three times by a triple roll by a gap of 40 to 50 μm to give an ink.

The viscosity of the ink of the imide-based photosensitive resin composition obtained was 160 poise (25° C.) and the solid content was 49.7 wt %. The ink did not show any change in viscosity even after storage at 5° C. for 30 days and exhibited an excellent storage stability.

EXAMPLE 2

A 75 μm dam was constructed on a 35 μm copper foil. Ink comprised of the photosensitive imide-based resin composition obtained in Example 1 was cast into it and a bar coater used to form a uniform coating.

Next, the coating was pre-baked in an 80° C. hot air oven for 30 minutes to remove the solvent.

The pre-baked film was exposed by a dosage of 100 to 200 mJ/cm$^2$ using a vacuum adhesion type superhigh pressure mercury lamp system (made by Oak Seisakusho, HMW-6N), developed using a 1% sodium carbonate aqueous solution by a spray type development system at 30° C. with a discharge pressure of 1.5 kgf/cm$^2$ for 2 to 3 minutes, then rinsed using water at a discharge pressure of 1 kgf/cm$^2$ for 1 minute. Thus patterns of a thickness of 21 μm and a 75 μm line/space pattern were formed.

EXAMPLE 3

The same procedure was followed as in Example 2 without forming a line/space pattern of the ink. This coating was photo-crosslinked and heat cured to form an insulating film which was then measured for physical properties.

The results are shown below:

Film Properties

1) Mechanical properties (heat treatment conditions: 200° C.×1 hour)

Tensile strength: 1.0 kgf/mm$^2$
Elongation rate: 36.8%
Initial elastic modulus: 15.5 kgf/mm$^2$ 2) Thermal properties (heat treatment conditions: 200° C.×1 hour)

5% weight loss temperature: 325° C.
Thermal decomposition temperature: 462° C.

3) Electrical properties (heat treatment conditions: 200° C.×2 hours)

Surface resistance (Ω-cm: DC 100V, 1 minute, according to JIS K 6911)
  Ordinary state C-40/23/50 (hr/° C./% RH): 3.8×10$^{15}$
  Humid state C-96/40/90 (hr/° C./% RH) 2.4×10$^{13}$
Insulation breakdown (kV/mm: 23° C., 50% RH, in atmosphere, according to JIS C 2110)
  Ordinary state C-40/23/50: 71.0
  Humid state C-96/40/90: 69.1
Dielectric constant (∈: AC 0 Hz, 100V, according to JIS K 6911)
  Ordinary state C-40/23/50: 4.3
  Humid state C-96/40/90: 4.7
Dielectric loss (tan δ: %, according to JIS K 6911)
  Ordinary state C-40/23/50: 1.1
  Humid state C-96/40/90: 3.7

4) Chemical resistance (heat treatment conditions, 200° C.×2 hours)

Weight loss rate (%) after immersion in 10% sodium hydroxide for 30 minutes: 2.8

Weight loss rate (%) after immersion in acetone for 30 minutes: 13

5) Hygroscopicity (heat treatment conditions: 200° C.×2 hours)

Weight gain rate (%) after immersion for 24 hours: 1.0

6) Radius of curvature: at least 300 mm

7) Solder heat resistance: at least 260° C.×10 sec

Comparative Example 1

Except for changing the molar ratio between the aromatic tetracarboxylic dianhydride and the diamine component from 150:100 to 100:100, the same procedure was followed as in Example 1 to obtain a polyimidosiloxane solution and imide-based photosensitive resin composition.

The developability of this imide-based photosensitive resin composition is shown below:

[Developability]

Sodium carbonate aqueous solution: Not developable

Organic solvent (N-methyl-2-pyrrolidone): Developable

Comparative Example 2

Except for not using 2-methacryloyloxethyl isocyanate, the same procedure was followed as in Example 1 to obtain an imide-based photosensitive resin composition.

The imide-based photosensitive resin composition was photo-crosslinked and heat cured to form an insulating film which was then evaluated for chemical resistance. The results are shown below:

Chemical resistance (heat treatment condition: 200° C.×2 hours): Poor

After immersion in 10% sodium hydroxide for 30 minutes: Entire amount dissolves

EXAMPLE 4

58.84 g (200 mmol) of a-BPDA was dissolved in 110 g of dimethyl triglyme in a reaction vessel, 112.75 (125 mmol) of α,ω-bis(3-aminopropyl)polydimethyl-siloxane (DAPSi, amino equivalent 451) was added, and the mixture was reacted at 180° C. for 1 hour. Next, 10.02 g (35 mmol) of MBAA was added, then the mixture was reacted for 4 hours to obtain an imidosiloxane oligomer solution (solid concentration: 60.8%).

4.12 g of 2-methacryloyloxyethyl isocyanate was added at room temperature to 100 g of this imidosiloxane oligomer solution diluted to a solid concentration of 60%, then the mixture was stirred for 1 hour. 0.58 g of Phthalocyanine Green was further added to this solution. The mixture was further stirred for 30 minutes to disperse it, then was filtered.

0.81 g of an anti-foam agent (Dow Chemical, DB-100), 4.12 g of a photoinitiator (Ciba-Geigy, Irgacure 651), 6.05 g of a half epoxy acrylate (made by Showa Highpolymer Co., Ltd., Ripoxy 630X-501), 1.11 g of a phosphoric ester-based photo-crosslinking agent having a methacryloyl group (made by Nippon Kayaku, PM2), 21.51 g of a half epoxy acrylate containing carboxy (made by Kagawa Chemical, ENC), 2.22 g of polyethyleneglycol dimethacrylate (made by Shin-Nakamura Chemical, NK-9G), 6.6 g of barium sulfate, and 3.3 g of Aerosil (made by Nippon Aerosil, Aerosil 200) were added to 37 g of the above filter solution and homogeneously stirred and allowed to stand overnight. This mixture was kneaded three times by a triple roll by a gap of 30 μm.

The viscosity of the imide-based photosensitive resin composition obtained was 110 poise (25° C.) and the solid content was 65.3 wt %. The ink did not show any change in viscosity even after storage at 5° C. for 30 days and exhibited an excellent storage stability.

EXAMPLE 5

A 75 μm dam was constructed on a 35 μm copper foil. Ink comprised of the photosensitive imide-based resin composition obtained in Example 4 was cast into it and a bar coater used to form a uniform coating.

Next, the coating was pre-baked in an 80° C. hot air oven for 30 minutes to remove the solvent.

The pre-baked film was exposed by a dosage of 100 to 300 mJ/cm$^2$ using a vacuum adhesion type superhigh pressure mercury lamp system (made by Oak Seisakusho, HMW-6N), developed using a 1% sodium carbonate aqueous solution by a spray type development system at 30° C. with a discharge pressure of 1.5 kgf/cm$^2$ for 2 minutes, then rinsed using water at a discharge pressure of 1 kgf/cm$^2$ for 1 minute. Thus, patterns of a thickness of 25 μm and a 75 μm line/space pattern were formed.

EXAMPLE 6

The ink of the imide-based photosensitive resin composition obtained in Example 4 was baked at 20020 C. for 1 hour without forming a line/space pattern to form an insulating film which was then measured for physical properties.

The results are shown below:

PM2: 10%

Film Properties

1) Mechanical properties

Tensile strength: 1.82 kgf/mm$^2$

Elongation: 4.1%

Initial elastic modulus: 80.4 kgf/mm$^2$

2) Thermal properties

5% weight loss temperature: 325° C.

3) Electrical properties

Volume resistance (Ω-cm: DC 100V, 1 minute, according to JIS K 6911)

Ordinary state C-40/23/50 (hr/° C./% RH): 3.5×10$^{15}$

Humid state C-96/40/90 (hr/° C./% RH) 1.2×10$^{13}$

4) Chemical resistance (heat treatment conditions, 200° C.×2 hours)

After immersion in 10% sodium hydroxide for 30 minutes: No change

EXAMPLE 7

Except for changing the amount of the phosphoric ester based photo-crosslinking agent having a methacryloyl group (made by Nippon Kayaku, PM2) to 2.5 wt % with respect to the photosensitive imidosiloxane oligomer, the same procedure was followed as in Examples 4 to 6 to obtain a photosensitive imide-based resin composition and insulating film.

The results are shown below:

Film Properties

1) Mechanical properties

Tensile strength: 2.02 kgf/mm$^2$

Elongation rate: 6.2%

Initial elastic modulus: 62.9 kgf/mm$^2$

2) Thermal properties
5% weight loss temperature: 325° C.
3) Electrical properties
Volume resistance (Ω-cm: DC 100V, 1 minute, according to JIS K 6911)
Ordinary state C-40/23/50 (hr/° C./% RH): 5.4×10$^{15}$
Humid state C-96/40/90 (hr/° C./% RH) 2.8×10$^{14}$
4) Chemical resistance (heat treatment conditions, 200° C.×2 hours)
After immersion in 10% sodium hydroxide for 30 minutes: No change

EXAMPLE 8

0.81 g of an anti-foam agent (Dow Chemical, DB-100), 0.53 g of a N,N-phenylcyclohexylN-nitrosoamine (made by Ouchi Shinko Chemical Industry, H-2) (2 wt % with respect to the photosensitive imidosiloxane oligomer) as an N-nitroso-based anti-gelling agent, 4.12 g of a photoinitiator (Ciba-Geigy, Irgacure 651), 6.05 g of a half epoxy acrylate (made by Showa Highpolymer, Ripoxy 630X-501), 1.11 g of a methacryloyl phosphate (made by Nippon Kayaku, PM2), 21.51 g of a half epoxy acrylate containing carboxy (made by Kagawa Chemical, ENC), 2.22 g of polyethyleneglycol dimethacrylate (made by Shin-Nakamura Chemical, NK-9G), 6.6 g of barium sulfate, and 3.3 g of Aerosil (made by Nippon Aerosil, Aerosil 200) were added to 37 g of the filtered solution obtained at Example 4 and uniformly stirred and allowed to stand overnight. This mixture was kneaded three times by a triple roll by a gap of 30 μm.

The viscosity of the imide-based photosensitive resin composition obtained was 105 poise (25° C.) and the solid content was 66.2 wt %. The ink did not show any change in viscosity even after storage at 5° C. for 30 days and exhibited an excellent storage stability.

EXAMPLE 9

A 75 μm dam was constructed on a 35 μm copper foil. Ink comprised of the photosensitive imide-based resin composition obtained in Example 1 was cast into it and a bar coater used to form a uniform coating.

Next, samples of the coating were pre-baked in an 80° C. hot air oven for 30 minutes, 45 minutes, 60 minutes, and 75 minutes to remove the solvent.

The pre-baked films were exposed by a dosage of 100 to 200 mJ/cm$^2$ using a vacuum adhesion type superhigh pressure mercury lamp system (made by Oak Seisakusho, HMW-6N), developed using a 1% sodium carbonate aqueous solution by a spray type development system at 30° C. with a discharge pressure of 1.5 kgf/cm$^2$ for 2 to 3 minutes, then rinsed using water at a discharge pressure of 1 kgf/cm$^2$ for 1 minute. Next, Next, patterns of a thickness of 26 μm, 0.2 mm lines, line/space=0.2 and line/space=0.1 were formed. In each case, an excellent patterning work efficiency was exhibited.

EXAMPLE 10

Except for post-baking the pre-baked film at 200° C. for 1 hour, the same procedure was followed as in Example 9 to photo-crosslink and heat cure a coating and form an insulating film. The physical properties were then measured.

The results are shown below:
Film Properties
1) Mechanical properties
Tensile strength: 1.82 kgf/mm$^2$
Elongation rate: 4.1%
Initial elastic modulus: 80.4 kgf/mm$^2$ 2) Thermal properties
5% weight loss temperature: 325° C.
3) Electrical properties
Volume resistance (Ω-cm: DC 100V, 1 minute, according to JIS K 6911)
Ordinary state C-40/23/50 (hr/° C./% RH): 3.5×10$^{15}$
Humid state C-96/40/90 (hr/° C./% RH) 1.2×10$^{13}$
4) Chemical resistance (heat treatment conditions, 200° C.×2 hours)
After immersion in 10% sodium hydroxide for 30 minutes: No change

EXAMPLE 11

Except for changing the amount of the N-nitroso-based anti-gelling agent (H-2) to 1.0 wt % with respect to the photosensitive imidosiloxane oligomer, the same procedure was followed as in Example 9.

Samples of the coating were pre-baked for 30 minutes, 45 minutes, 60 minutes, and 75 minutes to form patterns of a thickness of 28 μm, 0.2 mm lines, line/space 0.2, and line/space=0.1. In all cases, good patterning work efficiency was exhibited.

Summarizing the effects of the invention, the imide-based photosensitive resin composition of the present invention has a stable storage stability, can be developed by a weak alkali, and can be post-baked at a relatively low temperature.

The insulating film of the present invention has good electrical properties, heat resistance, acid resistance, and alkali resistance.

Further, according to the present invention, it is possible to easily form an insulating film exhibiting excellent properties.

While the invention has been described with reference to specific embodiments chosen for purpose of illustration, it should be apparent that numerous modifications could be made thereto by those skilled in the art without departing from the basic concept and scope of the invention.

What is claimed is:
1. An insulating film, obtained by coating a photosensitive resin composition on a substrate;
prebaking the resin composition to form a thin film;
irradiating the resin composition patternwise with light;
alkali developing the resin composition to remove the non-irradiated parts of the resin composition; and
post-baking the resin composition to obtain a cured film, wherein the photosensitive resin composition comprises
a photosensitive imidosiloxane oligomer;
an isocyanate having an unsaturated bond;
a photopolymerization initiator; and
an organic solvent;

wherein the amount of the photosensitive imidosiloxane oligomer used is 100 parts by weight, the amount of the isocyanate is 1 to 80 parts by weight, and the amount of the photopolymerization initiator is 0.01 to 30 parts by weight, and wherein the photosensitive imidosiloxane oligomer comprises a reaction product of an epoxy compound having a photosensitive group and an imidosiloxane oligomer having a functional group reactive with an epoxy group, wherein the imidosiloxane oligomer having a functional group reactive with an epoxy group is obtained by reacting 70 to 90 mol % of total diamines with 100 mol % of tetracarboxylic dianhydride, wherein the total diamines consist of 10 to 50 mol % of an aromatic diamine having a functional group reactive with an epoxy group, 10 to 70 mol % of a diaminopolysiloxane, and 0 to 20 mol % of an aromatic diamine having plural benzene rings.

2. The insulating film according to claim 1, wherein the cured film has an elastic modulus of at least 5 kgf/mm$^2$ and not more than 100 kgf/mm$^2$.

3. The insulating film according to claim 1, wherein the cured film has an elongation rate of at least 5% and not more than 50%.

4. The insulating film according to claim 1, wherein the photosensitive resin composition further comprises (5) a phosphoric ester photo-crosslinking agent having a (meth)acryloyl group.

5. The insulating film according to claim 4, wherein the photo-crosslinking agent is present in an amount of 1 to 15 parts by weight with respect to 100 parts by weight of the photosensitive imidosiloxane oligomer.

6. The insulating film according to claim 4, wherein the photosensitive resin composition further comprises at least one of an inorganic filler, an anti-foam agent, an anti-gelling agent, a coloring agent and a pigment.

7. A process for preparing an insulating film, comprising coating a photosensitive resin composition on a substrate;

prebaking the resin composition to form a thin film;

irradiating the resin composition patternwise to a ray of light;

alkali developing the resin composition to remove the non-irradiated parts of the resin composition; and post-baking the resin composition to obtain a cured film, wherein the photosensitive resin composition comprises a photosensitive imidosiloxane oligomer;

an isocyanate having an unsaturated bond;

a photopolymerization initiator; and an organic solvent; ps wherein the amount of the photosensitive imidosiloxane oligomer used is 100 parts by weight, the amount of the isocyanate is 1 to 80 parts by weight, and the amount of the photopolymerization initiator is 0.01 to 30 parts by weight, and wherein the photosensitive imidosiloxane oligomer comprises a reaction product of an epoxy compound having a photosensitive group and an imidosiloxane oligomer having a functional group reactive with an epoxy group, wherein the imidosiloxane oligomer having a functional group reactive with an epoxy group is obtained by reacting 70 to 90 mol % of total diamines with 100 mol % of tetracarboxylic dianhydride, wherein the total diamines consist of 10 to 50 mol % of an aromatic diamine having a functional group reactive with an epoxy group, 10 to 70 mol % of a diaminopolysiloxane, and 0 to 20 mol % of an aromatic diamine having plural benzene rings.

8. The process for preparing an insulating film according to claim 7, wherein post-baking is carried out at not more than 250° C.

9. A process for preparing the insulating film of claim 7, wherein the photosensitive resin composition further comprises a photo-crosslinking agent.

10. The process according to claim 9, wherein the photo-crosslinking agent is a phosphoric ester containing a (meth)acryloyl group.

11. The process according to claim 9, wherein the photosensitive resin composition further comprises at least one of an inorganic filler, an anti-foam agent, an anti-gelling agent, a coloring agent and a pigment.

* * * * *